(12) United States Patent
Koga et al.

(10) Patent No.: US 6,349,397 B1
(45) Date of Patent: Feb. 19, 2002

(54) SIGNAL PROCESSING APPARATUS HAVING NON-VOLATILE MEMORY AND PROGRAMMING METHOD OF THE NON-VOLATILE MEMORY

(75) Inventors: Kiyokazu Koga; Hiroaki Arai, both of Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/365,893

(22) Filed: Aug. 3, 1999

(30) Foreign Application Priority Data

Aug. 14, 1998 (JP) .......................................... P10-229853

(51) Int. Cl.[7] .............................................. G01R 31/28
(52) U.S. Cl. ........................................ 714/727; 714/30
(58) Field of Search .......................... 714/30, 726, 727, 714/33, 725

(56) References Cited

U.S. PATENT DOCUMENTS

| 5,519,715 | A | | 5/1996 | Hao et al. | |
|---|---|---|---|---|---|
| 5,819,025 | A | * | 5/1996 | Williams | 714/30 |
| 6,028,983 | A | * | 2/2000 | Jaber | 714/30 |
| 6,195,774 | B1 | * | 2/2001 | Jacobson | 714/727 |

FOREIGN PATENT DOCUMENTS

| EP | 0511752 A1 | 4/1992 |
|---|---|---|
| EP | 0639006 A1 | 2/1995 |
| EP | 0884599 A1 | 12/1998 |

OTHER PUBLICATIONS

European Search Report dated Apr. 13, 2000.

* cited by examiner

Primary Examiner—Emmanuel L. Moise
(74) Attorney, Agent, or Firm—Rader, Fishman & Grauer PLLC; Ronald P. Kananen, Esq.

(57) ABSTRACT

The present invention provides a signal processing apparatus having at least a boundary scan chain for carrying out a boundary scan test, a CPU capable of being controlled by the boundary scan chain, a non-volatile memory for storing an operating program of the CPU and necessary data, and an input terminal for inputting data and other control signals from the outside to the boundary scan chain, a register for holding data transferred from the boundary scan chain and a memory for holding the data read from the register. During data rewriting, based on the control of the boundary scan chain, a rewriting program is input via the input terminal from a writing device to the boundary scan chain and then stored in the memory through the register, the CPU inputs rewriting data to write it into the non-volatile memory based on the control of the rewriting program stored in the memory.

8 Claims, 6 Drawing Sheets

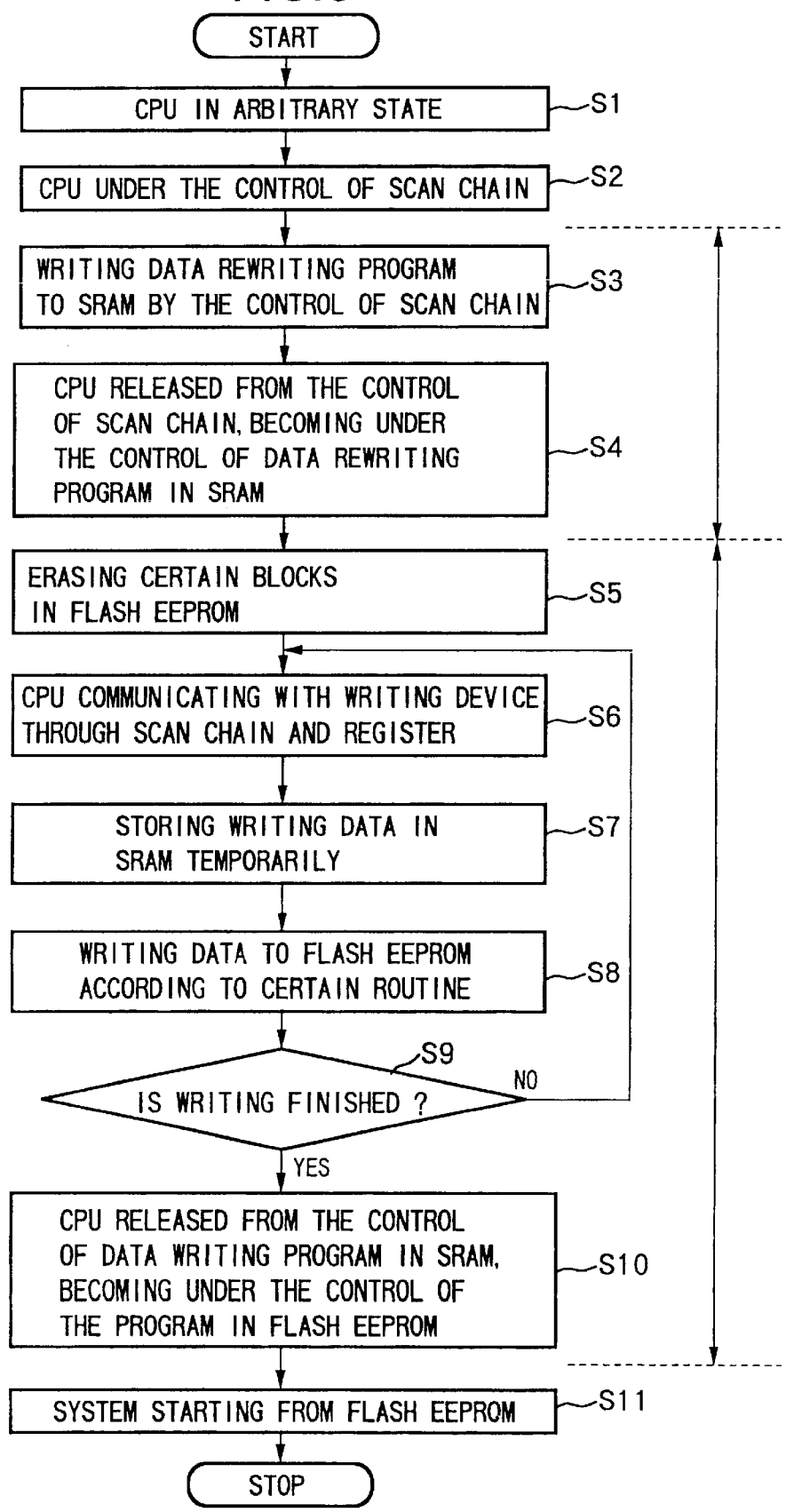

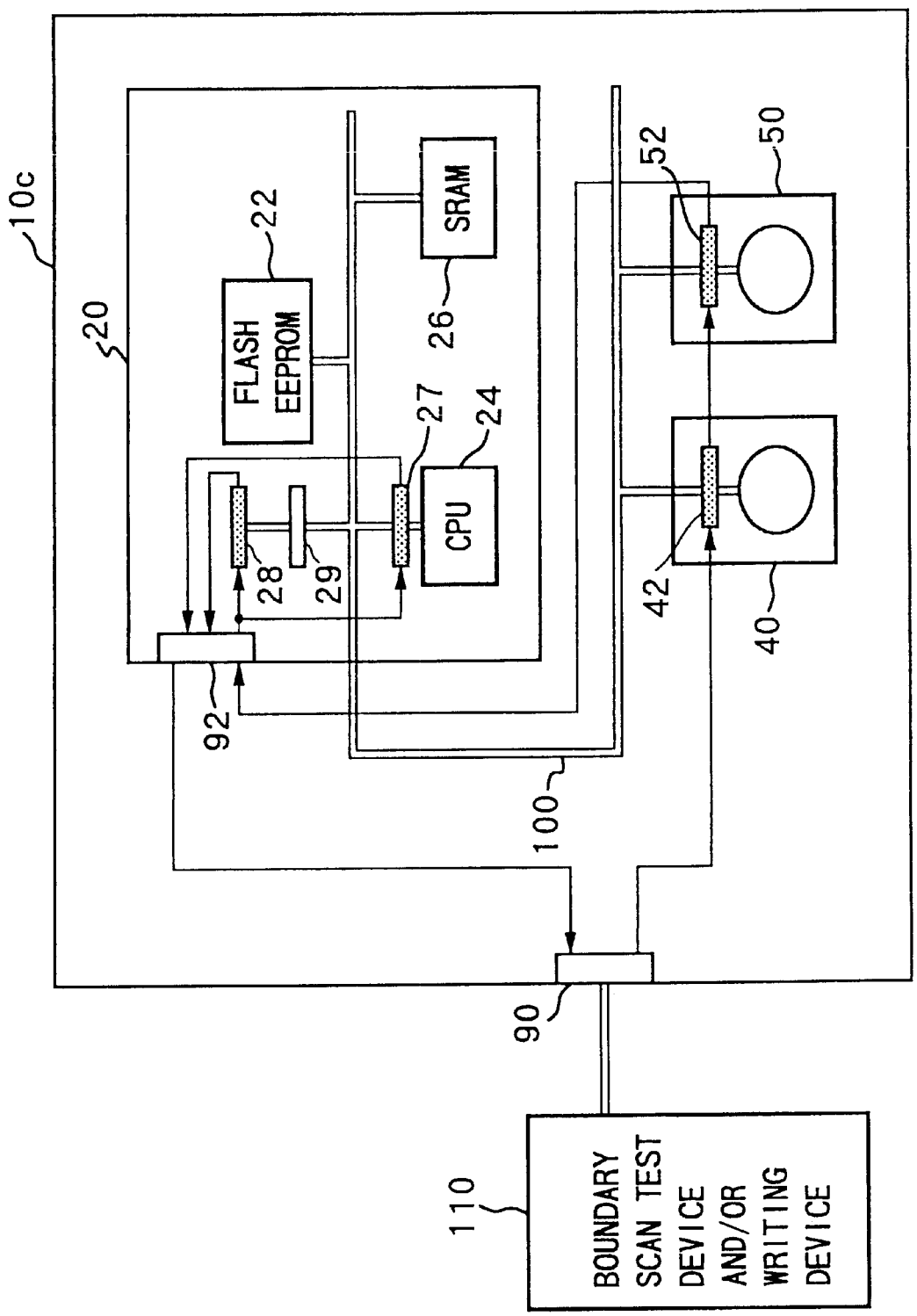

SIGNAL PROCESSING APPARATUS HAVING NON-VOLATILE MEMORY AND PROGRAMMING METHOD OF THE NON-VOLATILE MEMORY

BACKGROUND OF THE INVENTION

1. Field of the Invention

The present invention relates to a signal processing apparatus having at least a central processing unit (CPU) and a non-volatile memory capable of being rewritten from the outside and a programming method of the non-volatile memory.

2. Description of the Related Art

In recent years, along with the improvement of the technology for production of semiconductors, semiconductor devices with high integration and high density are becoming easier to realize. For example, a large number of semiconductor devices have been realized by integration of CPUs and memories and other different types and applications of semiconductor circuits on a single substrate such as with application-specific integrated circuits (ASIC).

As an example of such a semiconductor device, there is for example a semiconductor device with a CPU and a non-volatile memory for storing a program for controlling the operation of the CPU and further a memory to and from which ordinary data is written and read, for example, an SRAM, formed together on its substrate. In this, as the non-volatile memory for storing the program, for example, there are a read-only memory (ROM) or an EEPROM or flash EEPROM which are capable of rewriting and storing written data semipermanently.

In such a semiconductor device, by rewriting the program stored in the non-volatile memory in accordance with need from the outside, a programmable semiconductor device can be realized, different functions can be realized in response to the requests of users, and a semiconductor device of a high flexibility can be provided.

In such programmable semiconductor devices, there are different types of rewritable non-volatile memories. The rewriting routines differ depending on the type. In the past, the rewriting had been carried out according to the rewriting routines inherent to the semiconductor devices. Here, the program for performing the rewriting routine is called a data rewriting program. That is, generally, it is necessary to prepare a rewriting program for each semiconductor device using a different type of non-volatile memory.

In order to rewrite the programming codes, data, and so forth stored in the non-volatile memory of a semiconductor device (hereinafter simply referred to as "data" for convenience), usually a writing device is connected to the semiconductor device to be rewritten and that writing device is used to rewrite the data while as controlling the operation of the CPU in the semiconductor device. Note that the data rewriting being referred to here includes, for example, erasure of data, partial erasure, verification after writing, and so forth according to need depending on the type of the non-volatile memory.

As one example of a rewriting device of a non-volatile memory in a semiconductor device, there is the art disclosed in Japanese Unexamined Patent Publication (Kokai) No. 5-189584. In this example, a data rewriting program is loaded in advance into the semiconductor device. Namely, a memory, for example, a ROM, for storing the data rewriting program is provided in the semiconductor device. When rewriting the data, a CPU loads the data rewriting program from the ROM, then controls the data rewriting in accordance with the loaded program.

FIG. 1 shows an example of the configuration of a system constituted by a semiconductor device and a writing device for rewriting data to the semiconductor device. As illustrated, the semiconductor device 10a is constituted by a microprocessor 20a, a switch 30, functional circuits 40, 50, and a connector 70. The writing device 60 transfers writing data to the microprocessor 20a through the connector 70 to provide rewriting data and commands necessary for data rewriting to the microprocessor 20a.

The microprocessor 20a is constituted by a ROM switching circuit 21, a flash EEPROM 22, a data receiver (UART) 23, a CPU 24, a ROM (Boot ROM) 25, and an SRAM 26.

Each component circuit in the microprocessor 20a mentioned above transfers data and control signals through a data bus and control signal line (hereinafter simply referred to as a "bus" for convenience). Furthermore, the microprocessor 20a transfers data or control signals with the functional circuits 40 and 50 through the same bus 100.

In the microprocessor 20a, the data receiver 23 receives data from the writing device 60 and transfers it to the CPU 24 through the bus 100.

The CPU 24 outputs the data or control signals to the other component circuits through the bus 100 to control the operations of the component circuits.

The ROM switching circuit 21 outputs an enable signal for enabling the flash EEPROM (hereinafter referred to as flash memory) 22 or the ROM 25 in accordance with a switching signal S30 from the switch 30.

The flash memory 22 stores commands or other data for controlling the operation of the CPU 24. Note that the stored data in the flash memory 22 is rewritten based on the control of the writing device 60.

The ROM 25 stores the data rewriting program.

The SRAM 26 temporarily holds the data transferred through the bus 100 and outputs the held data to the other component circuits.

During ordinary operation, a signal S30 having a certain fixed level is output from the switch 30. The ROM switching circuit 21 outputs the enable signal to the flash memory 22 accordingly. In this case, during the initialization of the semiconductor device 10a, the CPU 24 loads commands and data from the flash memory 22 selected by the ROM switching circuit 21, then operates in accordance with the loaded commands. For example, the CPU 24 controls the operations of the functional circuits 40 and 50 through the bus 100 to realize a desired function.

The data is rewritten by the routine shown in the flow chart of FIG. 2. In data rewriting, a control signal $S_c$ for switching the switch 30 is input from the writing device 60. Accordingly, the switch 30 switches (step SS1) and outputs a signal S30 different from that of the ordinary operation.

The ROM switching circuit 21 outputs the enable signal to the ROM 25 according to the signal S30 from the switch 30. Consequently, after the initialization of the semiconductor device 10a (step SS2), the data rewriting program is loaded from the ROM 25 selected by the ROM switching circuit 21 (step SS3) and the rewriting is controlled in accordance with the loaded commands. For example, the CPU 24 communicates with the writing device 60 through the data receiver 23 (step SS4), erases the flash memory 22 (step SS5), then once stores the rewriting data input from the writing device 60 into the SRAM 26 (step SS7), then writes the rewriting data stored in the SRAM 26 to the flash memory 22 (step SS8). Then, the CPU 24 judges whether the writing is finished or not (step SS9) and, if it is not finished, returns to step SS6, where it receives the next writing data from the writing device 60 and writes it into the flash memory 22.

When the data rewriting of the flash memory 22 is carried out normally, the CPU 24 switches the switch 30, and the ROM switching circuit 21 selects the flash memory 22 (step SS10). Accordingly, after the initialization of the semiconductor device 10a (step SS11), the rewritten program and data are loaded to the CPU 24 from the flash memory 22, and the system starts (step SS12).

In the flow chart of FIG. 2, in the operations from steps SS3 to SS9, the CPU 24 is controlled by the rewriting program loaded from the ROM 25. During this period, the program or data in the flash memory 22 is rewritten by the new program or data input from the writing device 60. In the other operation steps, the CPU 24 is controlled by the program loaded from the flash memory 22. Especially, in steps SS10 to SS12 after the data rewriting, the CPU 24 is controlled by the rewritten program in flash memory 22.

However, in the above-mentioned conventional semiconductor device, it is necessary that the ROM 25 storing the data rewriting program be mounted on the substrate in advance. It is also possible to store the data rewriting program in, for example the flash memory instead of the ROM, but in this case, part of the capacity of the flash memory mounted on the substrate is used for the data rewriting program and therefore there is a demerit that the effective capacity of the flash memory is decreased.

Further, a switch for switching the starting ROM is necessary for carrying out the data rewriting after mounting on the substrate. Hardware resources are therefore necessary. Further, since the data rewriting after mounting on the substrate is actually performed by switching the starting ROM by switching jumper wires and so forth, the data rewriting and the restarting of the CPU afterward become troublesome. Further, it is necessary to provide special terminals, connectors, and interconnections on the substrate for transferring the rewriting data, which results in an increase of the mounting area of the substrate. Further, since the routines for data rewriting differ from each other in accordance with the type of the non-volatile memory, there is a disadvantage that when the type of the non-volatile memory changes, it is necessary to change the rewriting program accordingly.

In recent years, along with the spread of the JTAG (Joint Test Action Group) standards, there has been increasing demand for substrate tests and chip tests on system substrates by boundary scan tests. Boundary scan tests are being used in connection tests between chips on a system substrate and tests inside chips.

When applying a boundary scan test to a chip including a CPU, generally both special hardware for rewriting the non-volatile memory and special hardware for the boundary scan test must be mounted on the substrate or on the chip including the CPU. FIG. 3 shows an example of the configuration of a semiconductor device provided with both hardware for data rewriting and hardware for a boundary scan test.

As illustrated in FIG. 3, the CPU 24 is provided with a boundary scan register 27 for carrying out the boundary scan test. Further, the functional circuits 40 and 50 are provided with boundary scan registers 42 and 52 for carrying out the boundary scan test, respectively. These boundary scan registers are connected to a boundary scan test device 80 through a special terminal 90. In the semiconductor device 10b of the present example, hardware for data rewriting, for example, the switch 30, the ROM switching circuit 21, and the connector 70, and hardware for the boundary scan test, for example, the connector 90, are provided separately. Consequently, the mounting area of the substrate increases. Furthermore, there is a waste of the hardware resources considering the fact that the data rewriting and the boundary scan test are normally separately carried out.

SUMMARY OF THE INVENTION

The present invention was made in consideration with such a circumstance and has as an object thereof to provide a signal processing apparatus making joint use of hardware resources for data rewriting and a boundary scan test so as to enable a reduction in the waste of the hardware resources, enable realization of a decrease of the substrate area, and enable flexible handling of the rewriting of different types of non-volatile memories, and a programming method thereof.

To achieve the above object, the signal processing apparatus of the present invention is a signal processing apparatus having at least a boundary scan chain for carrying out a boundary scan test, a central processing unit capable of being controlled by the boundary scan chain, a non-volatile memory for storing an operating program of the central processing unit and necessary data, and an input terminal for inputting data and other control signals from the outside to the boundary scan chain; wherein the semiconductor device further comprises a register for holding data transferred from the boundary scan chain and being read for the held data by the central processing unit and a memory for holding the data read from the register; a rewriting program is input via the input terminal from a writing device to the boundary scan chain and then stored in the memory through the register during data rewriting based on the control of the boundary scan chain; and the central processing unit inputs rewriting data through the input terminal and the boundary scan chain to write it into the non-volatile memory based on the control of the rewriting program stored in the memory.

Further, in the present invention, preferably the central processing unit reads the rewriting data from the register and stores the same in the memory then writes the rewriting data stored in the memory in a predetermined area of the non-volatile memory after the erasing operation.

Further, the present invention provides a programming method of a signal processing apparatus having at least a boundary scan chain for carrying out a boundary scan test, a central processing unit capable of being controlled by the boundary scan chain, a non-volatile memory for storing an operating program of the central processing unit and necessary data, and an input terminal for inputting data and other control signals from the outside to the boundary scan chain, comprising the steps of inputting a rewriting data program for controlling the rewriting operation of the non-volatile memory from a writing device connected to the input terminal to the boundary scan chain and reading out and storing into the memory the rewriting program transferred from the boundary scan chain, inputting rewriting data to be written into the non-volatile memory from the writing device through the input terminal and the boundary scan chain and storing the same in the memory by the central processing unit based on the control of the rewriting program stored in the memory, and writing the rewriting data stored in the memory to a predetermined area of the non-volatile memory after erasing the predetermined area.

Further, in the present invention, preferably, when the volume of the rewriting data is greater than the capacity of the memory, operations of inputting a portion of the rewriting data from the writing device, storing the portion of the rewriting data to the memory, and writing the portion of the rewriting data stored by the memory into the non-volatile memory are repeated until the rewriting data is completely written to the non-volatile memory by the central processing unit based on the control of the rewriting program.

According to the present invention, there is provided a signal processing apparatus comprising hardware for a boundary scan test which utilizes the hardware for the boundary scan test for data rewriting of the non-volatile memory built in the signal processing apparatus so as to share the hardware resources and reduce the chip area of the signal processing apparatus. More specifically, when rewriting data in the non-volatile memory, a data writing device is connected to a special input terminal for the boundary scan test, and a rewriting program for controlling the rewriting operation is input to the boundary scan chain by the data writing device. The rewriting program transferred by the boundary scan chain is read out from the central processing unit (CPU) through the register and then stored in the memory. After that, the CPU controls the data rewriting operation based on the control of the rewriting program stored in the memory. Due to this, a certain area of the non-volatile memory is erased, rewriting data is input from the writing device to the non-volatile memory and temporarily stored in the memory, then the stored data is written into the non-volatile memory. When the volume of the rewriting data of the non-volatile memory is larger than the storage capacity of the memory, since the operations of inputting part of the rewriting data, storing it in the memory, then writing it into the non-volatile memory are carried out repeatedly, the rewriting data is written into the non-volatile memory successively over several times.

BRIEF DESCRIPTION OF THE DRAWINGS

These and other objects and features of the present invention will become clearer from the following description of the preferred embodiments given with reference to the accompanying drawings, in which device:

FIG. 5 is a flow chart showing the data rewriting operation of the first embodiment; and FIG. 6 is a circuit diagram of a semiconductor device of a second embodiment according to the present invention.

DESCRIPTION OF THE PREFERRED EMBODIMENTS

Below, preferred embodiments will be described with reference to the accompanying drawings.

First Embodiment

Figure 4:
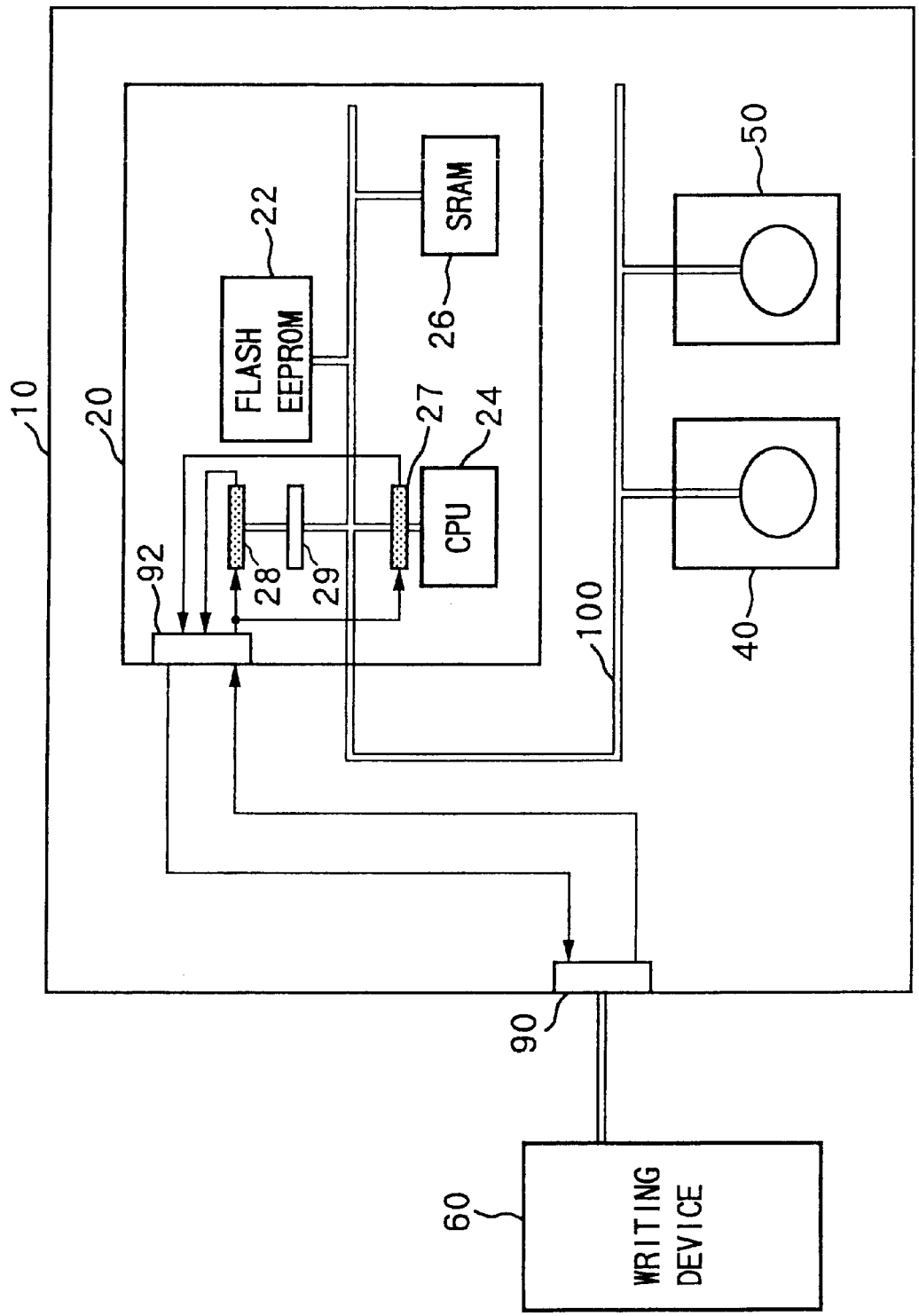
FIG. 4 is a circuit diagram of a semiconductor device of a first embodiment according to the present invention.

FIG. 4 is a circuit diagram of a first embodiment of a semiconductor device according to the present invention.

The semiconductor device of the present embodiment is constituted by a microprocessor 20 and functional circuits 40 and 50. The microprocessor 20 transfers data and control signals to and from the functional circuits 40 and 50 through a data bus and control signal line (hereinafter referred to simply as a bus).

The connector 90 is a special connector for the boundary scan test. In the present embodiment, the connector 90 is shared by the data rewriting and the boundary scan test. Consequently, in the semiconductor device 10 of the present embodiment, the special connector for the data rewriting is eliminated.

The microprocessor 20 is constituted by a flash EEPROM (hereinafter referred to as a flash memory) 22 provided as a non-volatile memory, a CPU 24, an SRAM 26, boundary scan chains (hereinafter simply referred to as scan chains for convenience) 27 and 28, and a register 29. Note that the register 29 is accessible from both of the scan chain 28 and the CPU 24 and that at least writing from the scan chain 28 and reading from the CPU 24 are possible. Each component circuit of the microprocessor 20 transfers data and control signals through the bus 100. Further, the microprocessor 20 is connected to a special connector 90 for the boundary scan test through a scan chain access port (hereinafter simply referred to as an access port) 92.

Note that the control specifications of the boundary scan test of the microprocessor 20 may be based on the JTAG (IEEE 1149.1) standard or be other specifications.

During the boundary scan test, a boundary scan test device is connected to the connector 90. By this test device, test data and so forth are transmitted to the scan chains 27 and 28 in the microprocessor 20. Further, test results are received from these scan chains. Whether the microprocessor 20 is operating normally or not can be judged according to the test results. On the other hand, during the data rewriting, a writing device 60 is connected to the connector 90. By the rewriting device, writing data is transferred to the scan chains 27 and 28 and the transferred data is read to the bus 100 through the register 29, temporarily stored in the SRAM 26, then written in the flash memory 22.

Below, an explanation will be made of the boundary scan test and the data writing of the semiconductor device 10 of the present embodiment.

During the boundary scan test, a not shown boundary scan test device is connected to the connector 90. Serial test data is output from the test device through the connector 90. The test data output from the test device is transferred to the microprocessor 20 through the access port 92. In the microprocessor 20, serial data input from the access port 92 is input to one of the scan chains 27 and 28. Note that the scan chains 27 and 28 are each constituted by a plurality of shift registers. The input serial data is successively shifted by these shift registers. The data of the scan chain 28 is transferred to the register 29 without going through the bus 100. That is, the register 29 converts the serial data input from the test device to parallel data. Further, the data in the register 29 is read out by the CPU 24. Due to this, predetermined test data is transferred from the test device connected to the outside of the semiconductor device 10 to the CPU 24. On the other hand, the scan chain 27 is able to transfer the test data directly to the CPU 24. In this case, the CPU 24 is able to perform the steps according to the test data.

Note that, as described above, the register 29 provided at the microprocessor 20 is a register accessible from both of the scan chain 28 and the CPU 24. The register 29 can at least be written by the scan chain 28 and read by the CPU 24, but preferably it is also capable of being written by the CPU 24 and being read by the scan chain 28. According to this, two-way communication between the boundary scan device and the CPU 24 can be realized and the operability and reliability of the test operation are improved.

The CPU 24 carries out predetermined processing in accordance with the test data transferred. For example, when testing the operation of the SRAM 26 in the microprocessor 20, predetermined test pattern data is transferred from the test device to the CPU 24. The CPU 24 writes the input test pattern to the SRAM 26, then reads the data from the SRAM 26. By comparing the writing test pattern with the read data, it can judge if the SRAM 26 is operating normally or not. Besides the SRAM 26, for example, when testing the functional circuits 40 and 50, the CPU 24 provides predetermined test data to the functional circuits being tested in accordance with the test data input from the test device and makes them operate. Since data indicating the result of the operation is output from the functional circuits, the CPU 24 can judge whether the functional circuits being tested are able to carry out the predetermined operations or not, according to the output data from the tested circuits.

During the data rewriting, as shown in FIG. 4, the writing device 60 is connected to the connector 90. The operation of the semiconductor device 10 at this time is shown by the flow chart in FIG. 5.

In the flow chart of FIG. 5, at steps S3 and S4, the CPU 24 is under the control of the boundary scan chain. During this time, the CPU 24 transfers the data rewriting program input from the rewriting device 60 to the SRAM 26. At steps S5 to S10, the CPU 24 is controlled by the data rewriting program loaded from the SRAM 26 and rewrites the flash memory 22 according to the operating routine set by the data rewriting program.

Below, a detailed explanation of the data rewriting in a semiconductor device of the present embodiment will be given referring to FIG. 4 and FIG. 5.

The CPU 24 is assumed to be in any normal operating state (S1). After the rewriting is started, first, the CPU 24 comes under the control of the boundary scan chain (S2). For example, one of the plurality of scan chains 27 and 28 provided in the microprocessor 20 is selected by the access port 92. The CPU 24 is set in the boundary scan mode. In this operating mode, the CPU 24 comes under the control of the scan chain by serial scanning of the data for placing it under the control of the boundary scan chain.

Next, under the control of the scan chain, the data rewriting program is input from the writing device 60 and stored in the SRAM 26 (S3). Specifically, for example, serial data format rewriting program codes are transferred from the writing device 60 through the connector 90 and the access port 92 of the microprocessor 20. The transferred data is input to the scan chain 27 selected by the access port 92. In the scan chain 27, the input data is successively shifted and transferred to the general purpose register in the CPU 24 after the shifting. The data in the general purpose register of the CPU 24 is transferred to the SRAM 26 through the bus 100 and stored in the SRAM 26.

Next, the CPU 24 is released from the control of the scan chain and comes under the control of the data rewriting program stored in the SRAM 26. Specifically, for example, the head address of the data rewriting program stored in the SRAM 26 is set in a program counter register of the CPU 24. Due to this, the data rewriting program stored in the SRAM 26 is executed in the CPU 24.

The CPU 24 operates under the control of the data rewriting program and erases certain blocks of the flash memory 22 (step S5). After that, the CPU 24 communicates with the writing device 60 through the scan chain 28 and the register 29 (step S6). Here, the register 29 is designed to be able to be written or read by both of the scan chain 28 and the CPU 24.

Due to this, the program codes and the other data (hereinafter referred to as the rewriting data) are input from the writing device 60 and stored in the empty areas of the SRAM 26 temporarily (step S7).

Next, the CPU 24 carries out the rewriting operation based on the control of the data rewriting program. Due to this, the rewriting data stored in the SRAM 26 is written into certain areas of the flash memory 22 in accordance with the writing routine of the flash memory 22 (step S8).

Note that, in the data rewriting operation, when the size of the rewriting data is larger than the capacity of the empty areas of the SRAM 26, after the stored data of the SRAM 26 is written to the flash memory 22, the routine returns to step S6, where the next rewriting data is transferred to the SRAM 26 and temporarily stored in the SRAM 26. The stored data of the SRAM 26 is written to certain areas of the flash memory 22. The operation from steps S6 to S8 is carried out repeatedly until all of the writing data in the writing device 60 is written to the flash memory 22.

After the data rewriting is finished (step S9), the CPU 24 is released from the control of the data rewriting program stored in the SRAM 26 and comes under the control of the program of the flash memory 22 (step S10). Specifically, for example, an address of a reset vector is set into a program counter register of the CPU 24. As a result, the system restarts from the program or data written into the flash memory 22. Due to this, the CPU 24 is controlled by the program or data after being rewritten into the flash memory 22. Thereafter, the CPU 24 operates based on the control of the new program and data rewritten in the flash memory 22.

Figure 1:
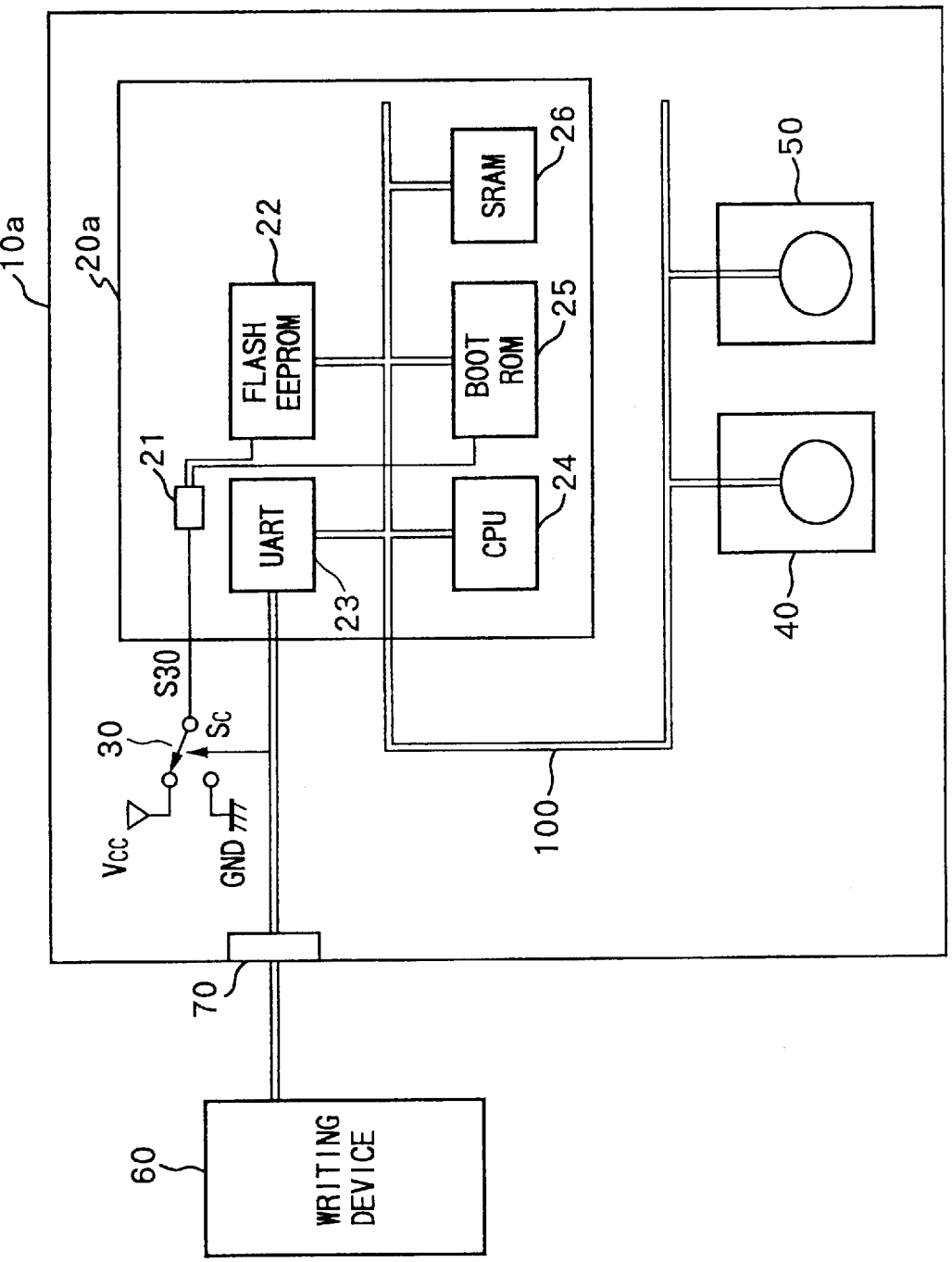
FIG. 1 is a circuit diagram of an example of the configuration of a conventional semiconductor device.
Figure 2:
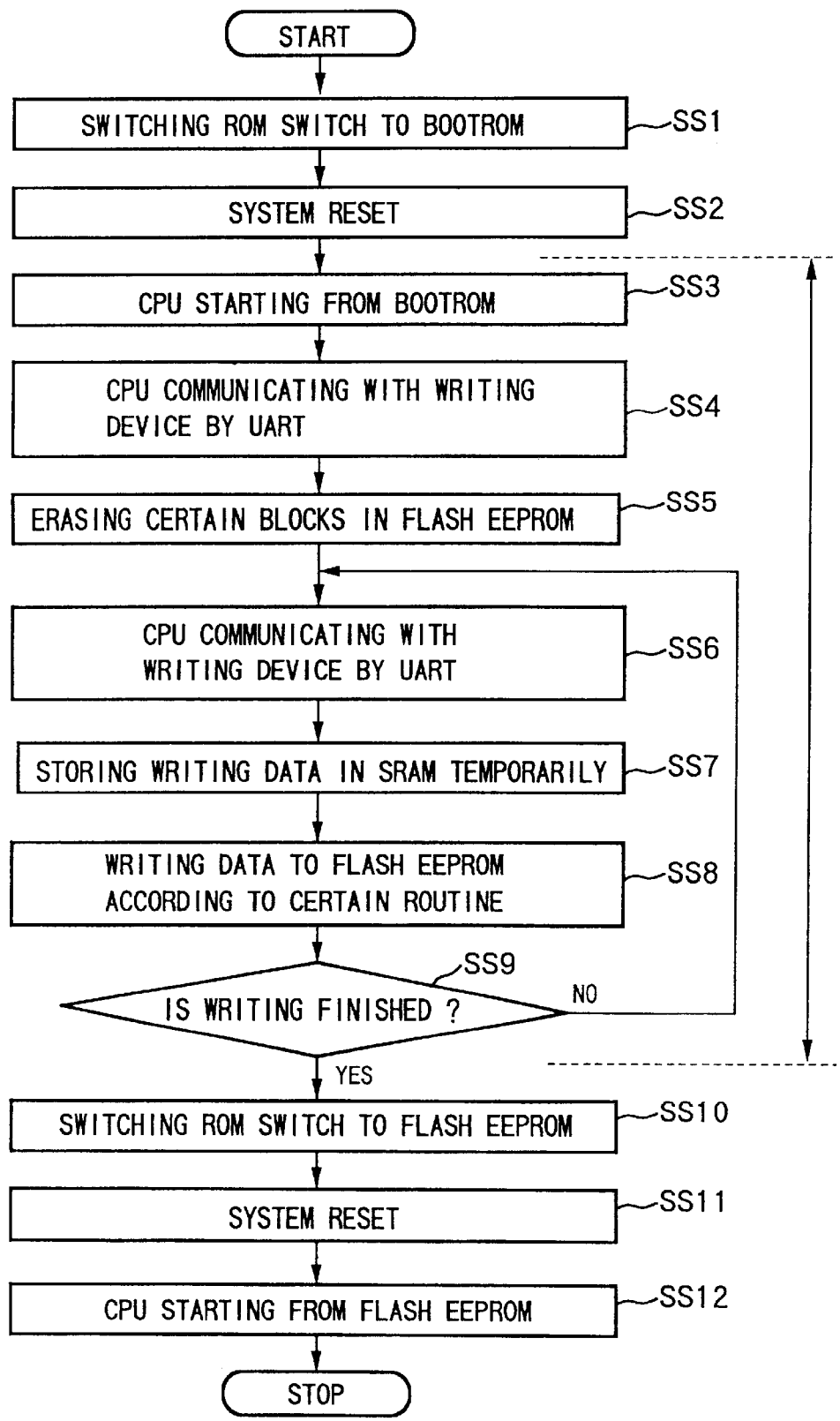
FIG. 2 is a flow chart showing the data rewriting operation of the semiconductor device shown in FIG. 1.
Figure 3:
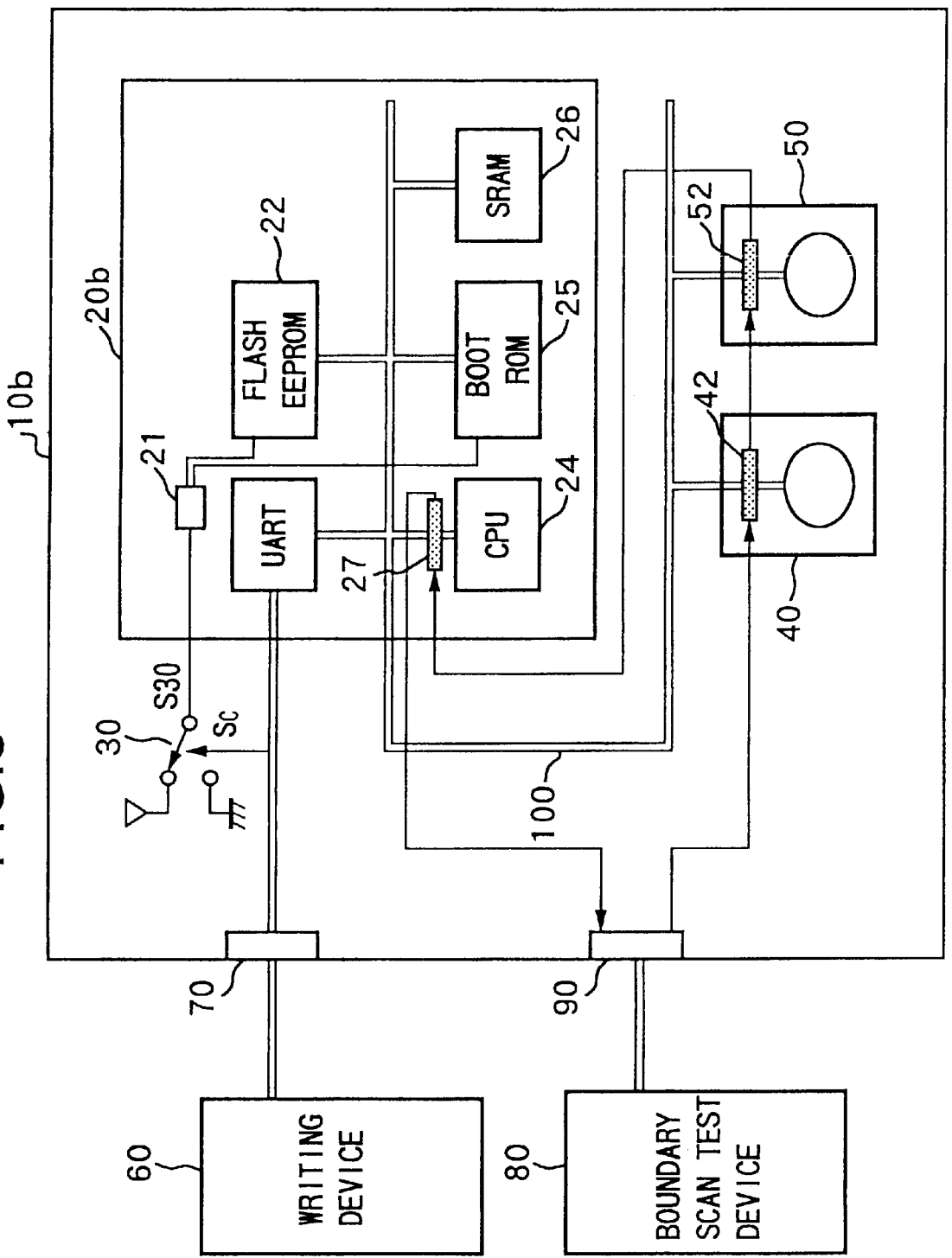
FIG. 3 is a circuit diagram of another example of a conventional semiconductor device.

As described above, in the present embodiment, compared with the conventional semiconductor device shown in FIG. 1, the scan chains 27 and 28 capable of controlling the CPU 24, the register 29, and the access port 92 for connecting to the scan chains 27 and 28 and the connector 90 are added. Generally, in a semiconductor device provided with a boundary scan test function, the boundary scan test chains 27 and 28 and the connection use access port 92 must be provided, so in the present embodiment, these are made use of without change. Comparing with the conventional semiconductor device, the data communication portion (UART) 23, the ROM 25, the ROM switching circuit 21, and the switch 30 can be eliminated.

Further, according to the present embodiment, since the data rewriting program is stored in the writing device 60 and transferred to the SRAM 26 built in the microprocessor 20 through the scan chains and the register before rewriting, it becomes easy to change the data rewriting program to handle rewriting of different types of flash memories.

Second Embodiment

FIG. 6 is a circuit diagram of a second embodiment of a semiconductor device according to the present invention.

As illustrated, the semiconductor device 10c of the present embodiment is configured substantially the same as the semiconductor device 10 of the first embodiment shown in FIG. 4. In the semiconductor device 10c of the present embodiment, however, boundary scan chains (hereinafter simply referred to as scan chains) 42 and 52 are arranged in the functional circuits 40 and 50. Due to this, the functional circuits 40 and 50 are able to independently execute the boundary scan test. This point differs from the semiconductor device 10 of the first embodiment. Note that, the control specifications of the boundary scan test of the microprocessor 20 and the functional circuits 40 and 50 can be based on the JTAG (IEEE 1149.1) standard or be some other specifications.

In the semiconductor device 10c of the present embodiment, the microprocessor 20 has the same configuration as the first embodiment shown in FIG. 4. As illustrated, in the present embodiment, the serial data input from the connector 90 is successively transferred through the scan chains 42 and 52 provided at the functional circuits 40 and 50, then input to the access port 92 of the microprocessor 20. In the microprocessor 20, the serial data transferred from the access port 92 is input to the scan chains 27 and 28. The data input to the scan chain 28 is transferred to the register 29 and converted into parallel data. The data input to the scan chain 27 is transferred directly to the CPU 24.

In the semiconductor device of the present embodiment shown in FIG. 6, the data rewriting is carried out for the flash memory 22 in substantially the same way as that of the first embodiment. Either of the boundary scan test device or the writing device is connected to the connector 90. The test data or the program codes are transferred to the scan chains 42 and 52 provided at the functional circuits through the connector 90 and are further transferred to one of the scan chains 27 and 28 selected by the access port 92.

During the boundary scan test, in the present embodiment, the boundary scan test device is connected to the connector 90. At this time, the test data and so forth is input from the connector 90 and transferred to the scan chains 42 and 52 in the functional circuits 40 and 50. Further, the data is input to the access port 92 of the microprocessor 20 and input to either of the scan chains 27 or 28 selected by the access port 92.

During the data rewriting, the writing device is connected to the connector 90. First, the data rewriting program and the necessary data are input from the connector 90 and transferred to the scan chains 42 and 52 of the functional circuits 40 and 50. Further they are input to the access port 92 of the microprocessor 20 and input to the scan chain selected by the access port 92.

The rewriting program input to the scan chain 27 is transferred to the general purpose register in the CPU 24. Due to this, the serial data is converted into parallel data. The data in the general purpose register is stored into the SRAM 26 through the bus 100. Then, the CPU 24 starts from the data rewriting program stored in the SRAM 26 and carries out the data rewriting by the operating routine set by the data rewriting program. Note that the data rewriting is carried out by the same operating routine as explained in the first embodiment. For example, certain blocks of the flash memory 22 are erased, and the rewriting data input from the writing device is stored once in the SRAM 26 and then written into certain areas of the flash memory.

After the rewriting of the flash memory 22 is finished, the CPU 24 restarts from the flash memory 22. As a result, the CPU 24 is able to execute a predetermined operation based on the new program rewritten into the flash memory 22.

As described above, according to the present embodiment, there is provided a semiconductor device supplied with a microprocessor 20 and functional circuits 40 and 50 having common boundary scan test specifications where the data rewriting of the flash memory built in the microprocessor is carried out by making use of the hardware of the boundary scan test and the data rewriting program is transferred through the scan chain and stored in the SRAM 26 temporarily. The CPU 24 rewrites the flash memory 22 under the control of the program stored in the SRAM 26. Consequently, by sharing the hardware resources in the boundary scan test and the data rewriting, special hardware for data rewriting can be eliminated and the increase of the substrate area can be suppressed while realizing both of the functions of the boundary scan test and the data rewriting.

As described above, according to the semiconductor device of the present invention, since the hardware of the boundary scan test is made use of in the data rewriting of the non-volatile memory built in the semiconductor device, special hardware for data rewriting is unnecessary and a decrease of the chip area of the semiconductor device including the microprocessor can be realized.

Further, in the present invention, the data rewriting program for controlling the operating routine of the data rewriting of the non-volatile memory can be held by an external writing device separate from the semiconductor device and it is possible to handle different routines for data rewriting in semiconductor devices provided with different types of non-volatile memories by simply changing the data rewriting program in the writing device. Further, if the specifications of the boundary scan test are the same, there is an advantage that it is possible to handle different microprocessors built in the semiconductor devices by simply changing the program of the writing device.

By applying the present invention to a semiconductor device provided with a microprocessor able to use the hardware resources of the boundary scan test for program debugging as well, an even greater effect can be achieved. That is, by loading a program for executing the routine of the present invention into the program debugger, the program debugging and the rewriting of the non-volatile memory can be realized by a single device and therefore convenience of program development of the semiconductor device can be improved greatly.

What is claimed is:

1. A signal processing apparatus having at least a boundary scan chain for carrying out a boundary scan test, a central processing unit capable of being controlled by the boundary scan chain, a non-volatile memory for storing an operating program of the central processing unit and necessary data, and an input terminal for inputting data and other control signals from the outside to the boundary scan chain; wherein said signal processing apparatus further comprises:

a register for holding data transferred from the boundary scan chain and being read for the held data by the central processing unit and a memory for holding the data read from the register;

a rewriting program is input via the input terminal from a writing device to the boundary scan chain and then stored in the memory through the register during data rewriting based on the control of the boundary scan chain; and the central processing unit inputs rewriting data through the input terminal and the boundary scan chain to write it into the non-volatile memory based on the control of the rewriting program stored in the memory.

2. A signal processing apparatus as set forth in claim 1, wherein the central processing unit erases a predetermined area of the non-volatile memory before writing the rewriting data to the non-volatile memory.

3. A signal processing apparatus as set forth in claim 2, wherein the central processing unit reads the rewriting data from the register and stores the same in the memory then writes the rewriting data stored in the memory in a predetermined area of the non-volatile memory after the erasing operation.

4. A signal processing apparatus as set forth in claim 1, wherein the memory is a random access memory.

5. A signal processing apparatus as set forth in claim 1, wherein when the volume of the rewriting data is greater than the capacity of the memory, based on the control of the rewriting program, the central processing unit repeats the operations of inputting a portion of the rewriting data from the writing device and storing the same to the memory then writing the portion of the rewriting data stored in the memory into the non-volatile memory until the rewriting data is completely written into the non-volatile memory.

6. A programming method of a signal processing apparatus having at least a boundary scan chain for carrying out a boundary scan test, a central processing unit capable of being controlled by the boundary scan chain, a non-volatile memory for storing an operating program of the central processing unit and necessary data, and an input terminal for inputting data and other control signals from the outside to the boundary scan chain, said programming method comprising the steps of:

inputting a rewriting data program for controlling the rewriting operation of the non-volatile memory from a writing device connected to the input terminal to the boundary scan chain and reading out and storing into the memory the rewriting program transferred from the boundary scan chain, inputting rewriting data to be written into the non-volatile memory from the writing device through the input terminal and the boundary scan chain and storing the same in the memory by the central processing unit based on the control of the rewriting program stored in the memory, and writing the rewriting data stored in the memory to a predetermined area of the non-volatile memory after erasing the predetermined area.

7. A programming method of a signal processing apparatus as set forth in claim 6, wherein when the volume of the rewriting data is greater than the capacity of the memory, operations of inputting a portion of the rewriting data from the writing device, storing the portion of the rewriting data to the memory, and writing the portion of the rewriting data stored by the memory into the non-volatile memory are repeated until the rewriting data is completely written to the non-volatile memory by the central processing unit based on the control of the rewriting program.

8. A semiconductor device having at least a boundary scan chain for carrying out a boundary scan test, a central processing unit capable of being controlled by the boundary scan chain, a non-volatile memory for storing an operating program of the central processing unit and necessary data, and an input terminal for inputting data and other control signals from the outside to the boundary scan chain; wherein said semiconductor device further comprises:

a register for holding data transferred from the boundary scan chain and being read for the held data by the central processing unit and a memory for holding the data read from the register;

a rewriting program is input via the input terminal from a writing device to the boundary scan chain and then stored in the memory through the register during data rewriting based on the control of the boundary scan chain; and the central processing unit inputs rewriting data through the input terminal and the boundary scan chain to write it into the non-volatile memory based on the control of the rewriting program stored in the memory.

* * * * *